(12) United States Patent
Gautier et al.

(10) Patent No.: US 9,083,381 B2
(45) Date of Patent: Jul. 14, 2015

(54) METHOD OF DETERMINING AT LEAST ONE PARAMETER OF AN ERROR-CORRECTING CODE IMPLEMENTED ON TRANSMISSION, CORRESPONDING DEVICE AND COMPUTER PROGRAM

(75) Inventors: Roland Gautier, Brest Cedex (FR); Eric Rannou, Brest Cedex (FR); Mélanie Marazin, Brest Cedex (FR); Gilles Burel, Brest Cedex (FR)

(73) Assignee: Universite de Bretagne Occidentale, Brest (FR)

( * ) Notice: Subject to any disclaimer, the term of this patent is extended or adjusted under 35 U.S.C. 154(b) by 258 days.

(21) Appl. No.: 13/808,837

(22) PCT Filed: Jul. 6, 2011

(86) PCT No.: PCT/EP2011/061444
§ 371 (c)(1),
(2), (4) Date: Mar. 14, 2013

(87) PCT Pub. No.: WO2012/004321
PCT Pub. Date: Jan. 12, 2012

(65) Prior Publication Data
US 2013/0166985 A1    Jun. 27, 2013

(30) Foreign Application Priority Data
Jul. 6, 2010 (FR) ..................................... 10 02833

(51) Int. Cl.
*H03M 13/00* (2006.01)
*H03M 13/33* (2006.01)
(Continued)

(52) U.S. Cl.
CPC .............. *H03M 13/00* (2013.01); *H03M 13/33* (2013.01); *H03M 13/3723* (2013.01);
(Continued)

(58) Field of Classification Search
CPC ..... H03M 13/00; H03M 13/05; H03M 13/11; H03M 13/23; H03M 13/29; H03M 13/6516; H03M 13/33; H03M 13/3723; H03M 13/6508; H03M 13/6513; H03M 13/2957
USPC .......................................... 714/775, 752, 788
See application file for complete search history.

(56) References Cited

U.S. PATENT DOCUMENTS 6,029,264 A * 2/2000 Kobayashi et al. ........... 714/755
6,118,832 A * 9/2000 Mayrargue et al. ........... 375/346
(Continued)

FOREIGN PATENT DOCUMENTS

| CN | 101534168 A | 9/2009 |
| CN | 101557233 A | 10/2009 |
| EP | 1471677 A1 | 4/2003 |

OTHER PUBLICATIONS

French Search Report and Written Opinion dated Mar. 23, 2011 for corresponding French Application No. 1002833, filed Jul. 6, 2010.
(Continued)

*Primary Examiner* — Guy Lamarre
(74) *Attorney, Agent, or Firm* — David D. Brush; Westman, Champlin & Koehler, P.A.

(57) ABSTRACT

A method and apparatus are provided for determining at least one parameter of an error correcting code implemented on transmission, termed a "coding parameter", by analyzing a binary train received. The method implements a first step making it possible to coarsely define said at least one coding parameter, and a second step making it possible to refine said at least one coding parameter.

11 Claims, 6 Drawing Sheets

(51) Int. Cl.
   *H03M 13/37*   (2006.01)
   *H03M 13/05*   (2006.01)
   *H03M 13/11*   (2006.01)
   *H03M 13/23*   (2006.01)
   *H03M 13/29*   (2006.01)

(52) U.S. Cl.
   CPC ..... *H03M 13/6513* (2013.01); *H03M 13/6516* (2013.01); *H03M 13/05* (2013.01); *H03M 13/11* (2013.01); *H03M 13/23* (2013.01); *H03M 13/29* (2013.01); *H03M 13/2957* (2013.01); *H03M 13/6508* (2013.01)

(56) References Cited

U.S. PATENT DOCUMENTS

| | | | | |
|---|---|---|---|---|
| 6,701,467 | B1 * | 3/2004 | Victor | 714/701 |
| 7,409,629 | B2 * | 8/2008 | Lehobey et al. | 714/785 |
| 2007/0098110 | A1 * | 5/2007 | Schmidt | 375/298 |

OTHER PUBLICATIONS

Marazin M, "Reconnaissance en aveugle de codeur a base de code concolutif: Contribution a la misa en oeuvre d'un recepteur intelligent", TEL (theses-en-ligne) Archive, May 28, 2010, p. 218PP, XP002629663. (with English Abstract).

International Search Report and Written Opinion dated Sep. 28, 2011 for corresponding International Application No. PCT/EP2011/061444, filed Jul. 6, 2011.

Anonymous, "Reed-Solomon Error Correction", Wikipedia, May 30, 2010, XP002659651. URL:http://web.archive.org/web/20100530211034/http://en.wikipedia.org/wiki/Reed%E2%80%93Solomon-error-correction.

Marazin M. et al., "Dual Code Method for Blind Identification of Convolutional Encoder for Cognitive Radio Receiver Design", GLOBCOM Workshops, 2009 IEEE, Nov. 30, 2009, pp. 1-6, XP031585748.

Marazin M, "Reconnaissance en aveugle de codeur a base de code concolutif: Contribution a la misa en oeuvre d'un recepteur intelligent", TEL (theses-en-ligne) Archive, May 28, 2010, p. 218PP, XP002629663.

Choqueuse et al., "Blind Recognition of Linear Space Time Block Codes", IEEE International Conference on Acoustics, Speech and Signal Processing. ICASSP 2008, Mar. 31, 2008, pp. 2833-2836, XP031251181.

Barbier et al., "Algebraic Approach for Reconstruction of Linear and Convolutional Error Correcting Codes" World Academy of Science, Engineering and Technology (WASET) respitory International Journal of Mathematical and Computer Science, vol. 2:3, Feb. 1, 2006, pp. 113-118, XP002659652.

Sicot et al., "Blind Detection of Interleaver Parameters 2005 IEEE International Conference on Acoustics, Sppeech Sppeech, and Signal Processing" Mar. 18-23, 2005, pp. 829-832, XP010793950.

International Preliminary Report on Patentability and English translation of Written Opinion dated Jan. 8, 2013 for corresponding International Application No. PCT/EP2011/061444, filed Jul. 6, 2011.

Dingel et al., "Parameter Estimation 1-4 of a convolutional encoder from noisy observations" Jun. 24, 2007, pp. 1777-1780, ISIT2007, Nice, France.

* cited by examiner

METHOD OF DETERMINING AT LEAST ONE PARAMETER OF AN ERROR-CORRECTING CODE IMPLEMENTED ON TRANSMISSION, CORRESPONDING DEVICE AND COMPUTER PROGRAM

CROSS-REFERENCE TO RELATED APPLICATIONS

This application is a Section 371 National Stage Application of International Application No. PCT/EP2011/061444, filed Jul. 6, 2011, which is incorporated by reference in its entirety and published as WO2012/004321 on Jan. 12, 2012, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The disclosure can be applied to various fields such as the blind recognition of error-correcting codes included in the binary digital transmission frames whose purpose is to make them more robust.

The present disclosure first of all relates to an optimized method of blind recognition of error-correcting codes without preliminary knowledge of the synchronization and length of segmentation of the binary frames.

The present disclosure also relates to a system of recognition of error-correcting codes capable of carrying out a real-time adaptive processing.

The disclosure also relates to the devising and perfecting of an algorithm known as the dual pivot algorithm, which is the basis of the algebraic processing of received data.

BACKGROUND OF THE DISCLOSURE

In telecommunications, it is frequent to describe a digital transmission by three elements, a sender, a receiver and a transmission channel. FIG. 1 provides a symbolic and simplified description of a sender 10 which transmits a coded signal through the transmission channel which will be decoded by the receiver 20. To augment the robustness of the transmission and overcome disturbances, there are known ways for those skilled in the art to include, in the signal to be transmitted, an error-correcting code aimed at reducing errors at reception.

Since error-correcting codes are presently essential for ensuring reliable transmission, total control and freedom during the implementation of the codes are crucial given the huge increase in standards, networks and hardware. In all the standards used, the preferred approach is that in which the sender and the receiver agree on the error-correcting code, either by fixing it once and for all, or by plain (or unencrypted) transmission of the encoding scheme and the code used. Although this approach forms the basis of classic communications, it is limited in that the codes chosen are part of a very restricted, fixed and unchanging list.

In order to improve digital transmission and overcome the above drawbacks, another solution consists in getting rid of the need for any preliminary agreement between the sender and the receiver on the error-correcting code used. This technique provides for flexibility in the management and dynamic control of networks by reducing or even eliminating problems of compatibility related to the diversity of present-day and future connected apparatuses in making them self-configuring from the viewpoint of the correcting codes used. In the transmission systems that have been conceived, the reception device must be configured in such a way that it can blindly identify the sender's parameters.

To date, there are certain number of existing blind detection techniques such as those proposed especially by Melanie Marazin et al. in "*Dual Code Method for Blind Identification of Convolutional Encoder for Cognitive Radio Receiver Design*" and "*Reconnaissance en aveugle de décodeur à base de code convolutif: Contribution à la mise en ceuvre d'un récepteur intelligent*" ("Blind recognition of decoders based on convolutive codes: Contribution to the implementation of a smart receiver"). However, the performance levels of the published algorithms are fairly limited. In particular, these algorithms work in configurations that take account of strong assumptions on the type of code used as well as the type of error envisaged. They therefore address a specific and limited type of error-correcting codes. Furthermore, the technical solutions proposed process only binary strings that contain few errors and have a known structure as regards parameters of segmentation length and/or synchronization. They do not work in flow conditions either, and are useful only in the post-processing of data.

SUMMARY

An exemplary embodiment of the invention pertains first of all to a method for the blind rebuilding of at least one parameter of the error-correcting code from at least one binary frame, said parameter being unknown, characterized in that said method comprises a first step designed to coarsely define the parameters of the code, the method being divided into:

the search for a length of segmentation of the data of the binary string compatible with the code sought.

the obtaining of candidate linear forms close to a possible dual code through the call on the dual pivot algorithm.

the validation of at least one linear form on at least one part of the segment read.

a coarse synchronization and a coarse segmentation of the data.

as well as a second distinct step designed for the refining of the parameters and being divided into:

the identification and testing of linear forms close to the dual code through the dual pivot algorithm.

an updating of the linear forms and a fine synchronization of the data.

a final validation of the linear forms describing the dual code used.

A goal of an embodiment of the invention is also a device for recognizing at least one parameter of an error-correcting code from at least one binary frame, said parameter being unknown, characterized in that the device uses means enabling the processing in data streams, the device comprising means associated with a first step intended to coarsely define the parameters of the code, divided into:

means for searching for a length of segmentation of the data compatible with the code sought.

means to obtain candidate linear forms close to a possible dual code through the use of the dual pivot algorithm.

means for validating at least one linear form on at least one part of the segment read.

means to provide for a coarse synchronization and a coarse segmentation of the data.

as well as means associated with a second step intended for the refining of the parameters and being divided into:

means for identifying and testing linear forms close to the dual code through the dual pivot algorithm.

means for updating the linear forms and for a fine synchronization of the data.

means for a final validation of the linear forms describing the dual code used.

The device thus constituted can carry the name "code-analyser" that synthesizes the function of analysis of error-correcting codes.

The first step of the method is aimed at having speedy and real-time information on the parameters of the error-correcting code, the second step being aimed at the refining of the information. An embodiment of the invention favorably uses a filtering system between these two steps.

According to one particular embodiment of the invention, the method comprises a step for filtering the binary string from the following parameters:

the at least one determined linear form, its localization in the frame.

The filtering system is an innovative self-adaptive device, which regulates the selection of the noisy words in real time as a function of the demands of the self-teaching analyzer and as a function of resources. It chooses to eliminate or not eliminate the data recognized as containing errors.

An embodiment of the invention therefore proposes a novel method for determining at least one parameter of an error-correcting code implemented when sending, called an encoding parameter, by analysis of a received binary string (which may or may not contain errors).

According to an embodiment of the invention, such a method implements:

a first step making it possible to coarsely define the encoding parameter or parameters implementing the following sub-steps:

selection of an integer value N' corresponding to a candidate size of the code words obtained during the implementation of the error-correcting code;

segmentation of the binary string, delivering segments of 2N' consecutive bits;

for at least one of the segments, determination, in the dual space of the error-correcting code, of at least one candidate linear form associated with a pseudo code word belonging to the segment, and validation of the candidate linear form or forms obtained;

if at least one candidate linear form is validated, re-centering and refining of the validated linear form or forms and coarse synchronization of the binary string;

updating of the encoding parameter or parameters;

and a second step enabling the refining of the encoding parameter or parameters, implementing at least one iteration of the following sub-steps:

filtering of the binary string, taking account of the validated linear form or forms and of pieces of information on segmentation and synchronization, delivering at least one new pseudo code word;

determination, in the dual space of the error-correcting code, of at least one candidate linear form associated with the new pseudo code word and validation of the candidate linear form or forms;

if at least one candidate linear form is validated, re-centering and refining of the validated linear form or forms, and fine synchronization of the binary string;

updating of the encoding parameter or parameters.

Such a method thus enables the blind determination, from a received binary string, which may or may not contain errors, of at least one essential parameter of an error-correcting code, such as a compatible size of segmentation of the data, a non-zero linear form of the error-correcting code in the dual domain, etc.

According to one particular aspect of an embodiment of the invention, the step of selection takes account of at least one element belonging to the group comprising:

the divisors of the value N';

a predetermined list of compatible integers.

The choice of the value N' can thus be guided by knowledge of current error-correcting codes and especially the codes most used, as well as error-correcting codes already encountered during the use of the method.

According to another characteristic of an embodiment of the invention, the step of determination of at least one candidate linear form associated with the pseudo code word of the first step is implemented for at least two segments of the binary string, and so long as the number of segments processed is below a predetermined threshold.

Thus, the maximum number of segments or pseudo code words used to generate linear forms close to the dual of the error-correcting code is limited.

According to one specific characteristic of an embodiment of the invention, the steps for determining at least one candidate linear form associated with the pseudo code word or a new pseudo code word implement a dual version of a Gauss pivot type of algorithm.

Thus, rather than using the classic Gauss pivot algorithm which works on vectors, the inventors have proposed a dual version of this algorithm centered on linear forms and not on the vectors. Thus, according to an embodiment of the invention, the computations are transposed into the dual of the error-correcting code, thus reducing processing complexity.

In particular, the dual version of the Gauss pivot type algorithm determines at least one candidate linear form in the following form:

if i is zero:

$$F_{0,j} = X_j;$$

if i is not zero:

$$F_{i,j} = F_{i-1,j} - \frac{F_{i-1,j}(v_i)}{F_{i-1,p_i}(v_i)} F_{i-1,p_i}$$

with:

N as a natural integer;

i a natural integer smaller than or equal to N;

k a natural integer smaller than i;

j an integer ranging from 1 to N, $(X_j)_{1 \leq j \leq N}$ the base that is the dual of the canonical base of $K^N$, where K is a field;

$P = \{p_1, \ldots, p_i\}$ a part of $\{1, \ldots, N\}$ with i elements;

$(v_k)_{1 \leq k \leq i}$ a free family of $K^N$ such that for any integer k between 1 and i, the vector $\bar{v}_k^{(v_l, p_l) 1 \leq l \leq k-1}$ obtained by reduction of the vector $v_k$ by the system $(v_l, p_l)_{1 \leq l \leq k-1}$ has a non-zero $p_k^{th}$ coordinate;

$F_{k,j}$ is the linear form which associates $F_{k,j}(v) = X_j(\bar{v}^{(v_l, p_l) 1 \leq l \leq k})$ with a generic vector v.

According to another aspect of an embodiment of the invention, the steps of validation of the candidate linear form or forms test the candidate linear form or forms on at least one following segment in the binary string (for example a series of segments) and compare a number of obtained zero values with a predetermined threshold.

Thus, a test is made on other pseudo code words the candidate linear forms obtained for a first pseudo code word.

According to one particular characteristic, steps of re-centering and refining of the linear form or forms validated implement a reduction of the size of the pseudo code word or of the new pseudo code word associated with the validated linear form or forms, by elimination of $\epsilon$ consecutive bits.

In this way, the number of bits useful for the computations is reduced, thus accelerating the processing operation.

Yet another aspect of an embodiment of the invention pertains to the step of filtering, which detects the segments of the binary string that do not verify at least one parity relationship defined by the validated linear form or forms and eliminates a segment detected as a function of the size of the binary string received.

In other words, the proposed filtering is self-adaptive and dynamically adapts the elimination of the data recognized as containing errors to the requirements of the method. Thus, it is possible to eliminate zero, one or more segments since an embodiment of the invention takes account of the size of the binary string received and therefore of the available segments (memorized in the buffer memory).

According to one particular characteristic, the method comprises a step for updating candidate linear forms preliminarily to the fine synchronization step, implementing a Gauss pivot type algorithm, making it possible to reduce each candidate linear form by all the other candidate linear forms.

Such an algorithm is a classic algorithm well known to those skilled in the art.

In particular, such an updating of the candidate linear forms leads to an adaptation of the filtering, since the filtering step takes account especially of the linear forms. The second step thus improves the "estimation" of the encoding parameter or parameters in the course of the iterations, in updating the filtering parameters at each iteration.

According to yet another characteristic, the method comprises a step of identification of at least one error-correcting code associated with the determined encoding parameter or parameters, by reading in a correspondence table.

In other words, once certain encoding parameters are identified, such as the length of the code words for example, it is possible to identify one or more potential error-correcting codes from among the codes habitually used, by reading a correspondence table for example.

In another embodiment, the invention pertains to a device for determining at least one parameter of an error-correcting code implemented when sending, called an encoding parameter, by analysis of a binary string received.

According to an embodiment of the invention, such a device comprises: first means enabling coarse definition of the encoding parameter or parameters comprising:
  means of selection of an integer value N', corresponding to a candidate size of the code words obtained during the implementation of the error-correcting code;
  means of segmentation of the binary string, delivering segments of 2N' consecutive bits;
  means of determining, activated for at least one of the segments in the dual space of the error-correcting code, of at least one candidate linear form associated with a pseudo code word belonging to the segment, and means of validation of the candidate linear form or forms;
  means of re-centering and refining of the validated linear form or forms and means of coarse synchronization of the binary string, activated if at least one candidate linear form is validated;
  means of updating the encoding parameter or parameters;
and second means making it possible to refine the encoding parameter or parameters comprising the following means, activated in the form of at least one iteration:
  means of filtering of the binary string, taking account of the validated linear form or forms and of the pieces of information on segmentation and synchronization, delivering at least one new pseudo code word;
  means of determining, in the dual space of the error-correcting code, of at least one candidate linear form associated with the new pseudo-code word, and means of validation of the candidate linear form or forms;
  means of re-centering and refining of the validated linear form or forms, and means of fine synchronization of the binary string, if at least one candidate linear form is validated;
  means of updating the encoding parameter or parameters.

Such a device is especially adapted to implementing the method for determining at least one encoding parameter described here above. It is for example localized at the entry to a receiver/decoder.

This device could of course comprise the different characteristics of the method for determining at least one encoding parameter according to an embodiment of the invention, which can be combined or taken in isolation. Thus, the characteristics and advantages of this device are the same as those of the method, and are therefore not described in more ample detail.

In another embodiment, the invention pertains to a computer program comprising instructions for the execution of the steps of the method for determining at least one encoding parameter described here above, when the program is executed by a computer.

An embodiment of the invention can also be implemented in various ways, especially in hard-wired form or in software form.

BRIEF DESCRIPTION OF THE DRAWINGS

Other advantages and features shall appear from the document. It would appear to be judicious at this point to describe the whole method and the means to be implemented to attain the goal of reconstruction in referring to the schematic drawings and algorithmic schemes that are introduced here.

DETAILED DESCRIPTION OF ILLUSTRATIVE EMBODIMENTS

1. General Principle

Here below, we describe the different modules involved in the method, in taking account of the fact that the architecture has been conceived so as to be adaptive and to derive benefit from iterative computations leading to gains in time and resources. For this reason, the sequencing of the processing blocks described here below should not be seen as purely sequential. Those skilled in the art will understand the possible imbrications between the blocks and the flexibility of operation of the system here below in the description.

Figure 3:
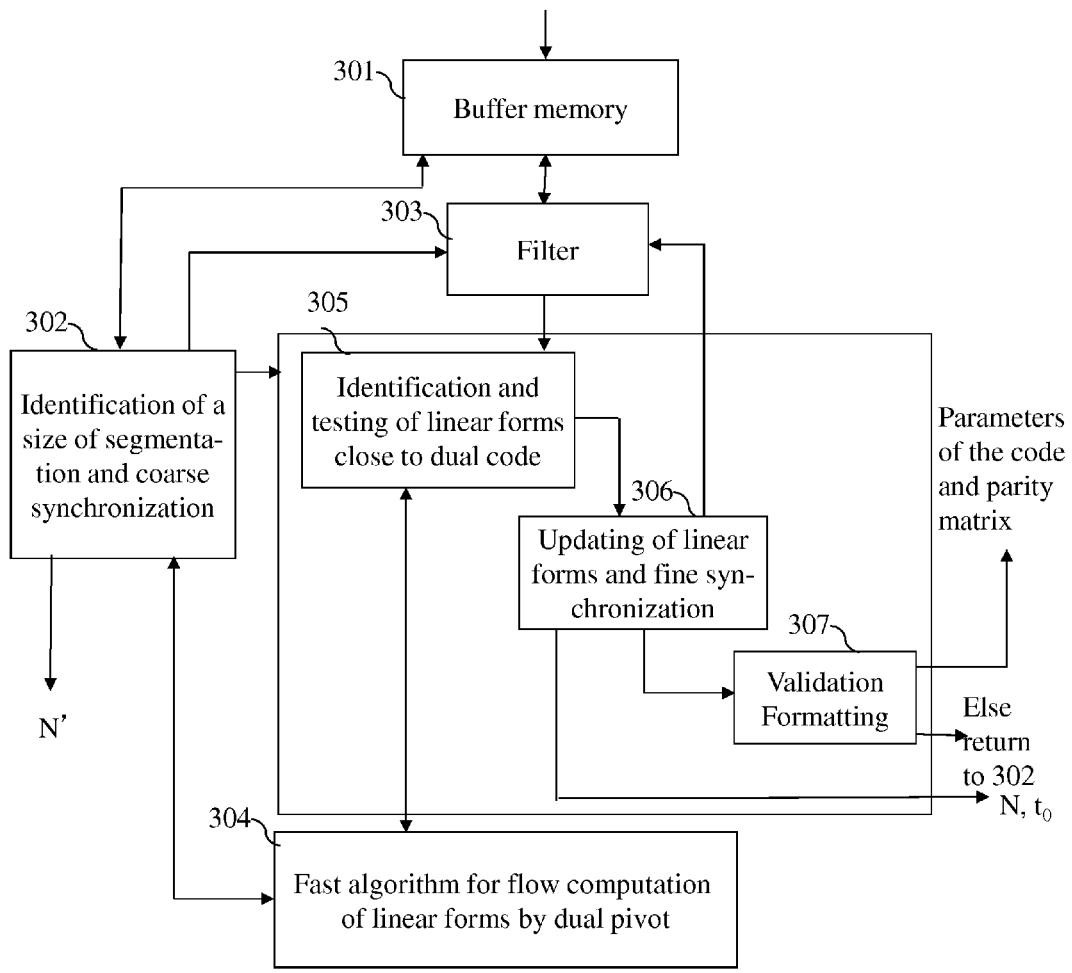
FIG. 3 represents the main blocks of an embodiment of the invention and their interactions.

FIG. 3 describes the blocks involved in an embodiment of the invention.

A buffer memory 301 temporarily stores the binary string constituted by words of a location and a length N that are a priori unknown.

A module for segmentation of the binary string and coarse synchronization 302 receives the information transmitted by the buffer memory. The module retrieves data from the memory in the form of a segment of $2N'-1$ first bits of a data packet of a length $2N'$ which it uses as pseudo-words of the encoder. Each pseudo-word enables the building of $2N'-1$ linear forms that are candidates for belonging to the dual code by calling through the dual pivot algorithm. To this end, the module first of all transfers the segments of the binary string to the module for computing in linear forms 304 through the dual pivot algorithm and in return receives the linear forms. The module attributes a value N' of a probable multiple of a size of a code word of a size N, carries out the computation of the associated coarse synchronization and transmits the linear forms and the information on segmentation and synchronization to a parametrizable filtering device 303.

A parametrizable filtering device 303 which receives the linear forms and the information on synchronization, and commands the buffer memory 301. The device has to be seen as a self-adaptive system that adjusts the selection of the noisy words in real time as a function of the requests of the self-teaching analyzer and as a function of the resources.

The module for computing linear forms 304 containing the dual pivot algorithm of FIG. 5 which shall be described in greater detail here below.

The module for identifying and testing linear forms close to the dual code 305. The module tests the candidate linear forms on the new pseudo-words received filtered by the parametrable filtering device 303. A compatible linear form is a linear form which cancels out all the words of the code. It can happen that the pseudo-words received do not get totally get out when they comprise transmission errors.

The module for updating linear forms and for fine synchronization 306 which receives, from the module for identifying and testing linear forms close to the dual code 305, the linear forms that are compatible with the pseudo-words received. The module for updating and fine synchronization reorganizes the linear forms in integrating the new linear forms received and statistically validating or not validating the linear forms previously received. The module for updating and fine synchronization refines the synchronization. It transfers a set of linear filters describing the identified part of the dual code to the filter. The module for updating and fine synchronization also delivers the size N' of the code pseudo-words as well as the value representing the instant of synchronization which corresponds to a start of a data segment.

The module for validating and formatting delivers a set of linear forms describing the identified part of the dual code. The module for validating and formatting formats the parameters of the encoder through its dual code and looks at the completeness of the code. If the answer is negative, the module for validating and formatting commands the processing of a new set of data. The module for validating and formatting finishes by delivering the parameters of the code such as its type, the characteristics of the interleaver if need be (and puncturing pattern if relevant) and the linear forms generating the dual code.

2. Definitions

For the clarity of the description, we herein introduce the definitions of the elements which shall be used here below.

N: size of a code word.

N': size of a pseudo code word.

Nbseg: number of segments already used to build dual forms.

Nbmax(x): function predefined by the user which gives the maximum permitted number of segments or noisy pseudo-words sized x usable to generate linear forms close to the dual of the code.

$\epsilon$: number of consecutive bits that can be withdrawn at the end of any block with a size of $2N'$ bits in being sure that there remains a complete pseudo-word sized N' in the residual block.

M: reduction matrix.

$Ind_{min}$: position of the first non-zero coordinate of a linear form considered as belonging to the dual of the code.

$Ind_{max}$: position of the last non-zero coordinate of a linear form considered as belonging to the dual of the code.

NbWords: number of pseudo-words already exploited to build linear forms close to the dual of the code.

3. Example of Implementation of the Invention

It is desired initially to determine a segmentation length compatible with the structure induced by the encoder. What has to be done therefore is to test the N' candidate segmentation lengths until it is possible to detect a linear form of the dual of the error-correcting code and by that very fact make it possible, because of its localization in the code word, to determine a first coarse synchronization.

It is possible at this level to optimize the choice of values of N' to accelerate the processing process. Those skilled in the art know from experience that testing N' amounts to testing all its divisors. Furthermore, the N integers possessing fairly small first divisors are more frequently used in the codes. Other strategies are possible, especially the use of tables containing a list of the most usual integers N which would enable a reduction in the processing time. Another way that can be envisaged consists in the recognition of the sequences dedicated to the management of the network, thus making it possible to have direct knowledge of a multiple of N. These various approaches can be combined. Several strategies are therefore possible making it possible to adapt to the environment and to the constraints of the application.

Figure 4A:
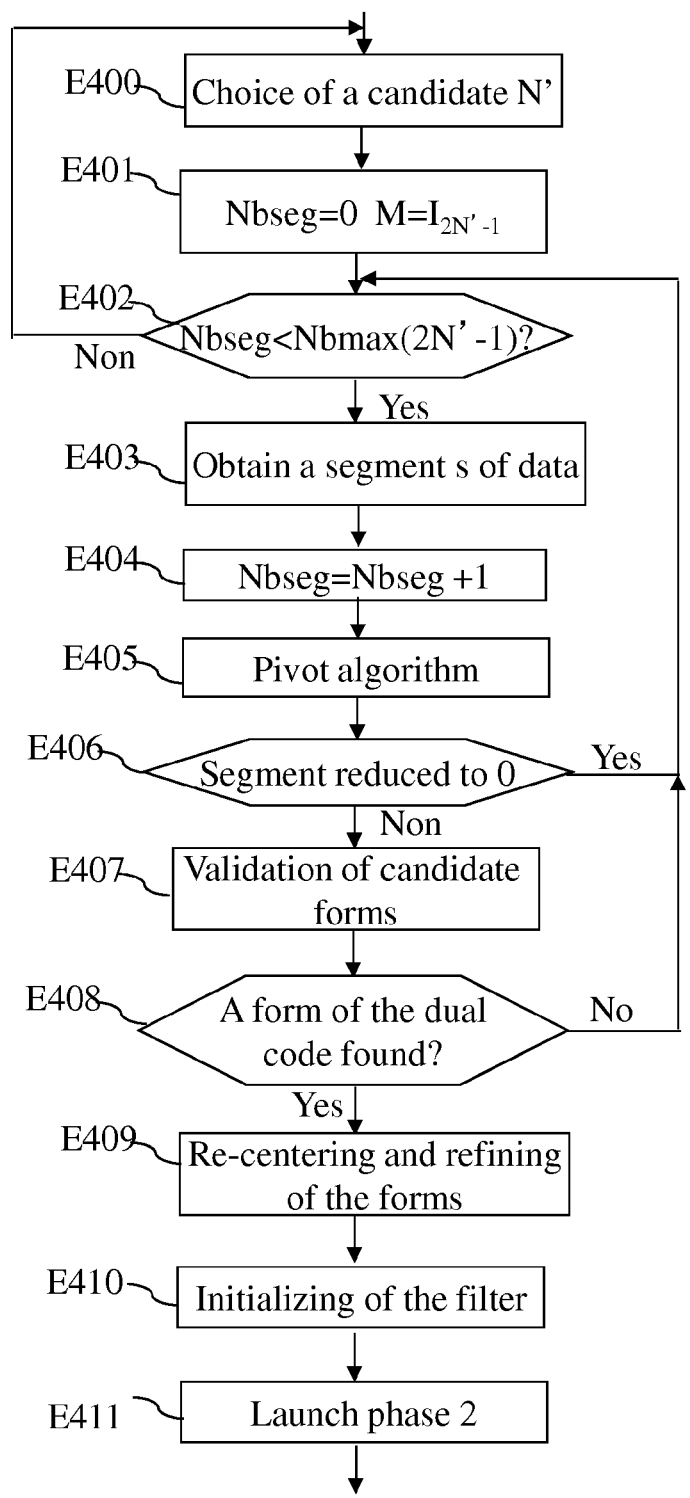
FIGS. 4a and 4b represent the process of blind rebuilding of the error-correcting codes.

We refer on FIG. 4a for the description. Initially, at the step E401, the method selects a value N' and segments the binary string into segments of 2N' consecutive bits.

The processing of the segments uses the variable Nbseg as well as the reduction matrix M. Through the step E401, the method sets the variable Nbseg at the zero value and sets the matrix M to be equal to the identity $I_{2N'-1}$ with a dimension $2N'-1$.

At the following step E402, the method according to an embodiment of the invention makes a check to see if the variable Nbseg is lower than the predetermined value Nbmax $(2N'-1)$. Nbmax(x) constitutes the maximum authorized number of segments or noisy pseudo-words sized x that can be used to generate linear forms close to the dual of the code.

At an iteration step Nbmax(x) also checks the end of the phase of searching for dual forms and gives access to the processing of the results. If the variable Nbseg is lower than the predetermined value Nbmax(2N'−1), the method passes to the step E403. If not, it returns to the start of the process.

Figure 1:
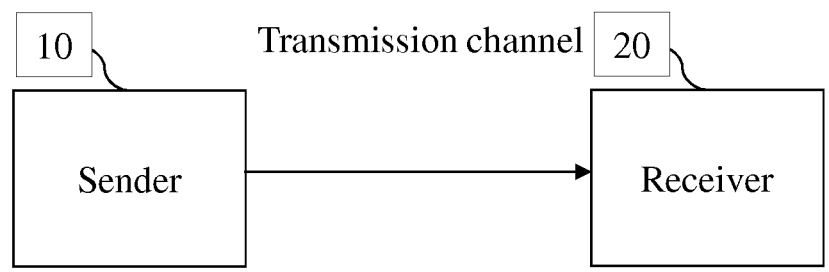
FIG. 1 described with reference to the prior art, is a symbolic representation of a sender and a receiver of a binary string based on digital transmission.
Figure 2A:
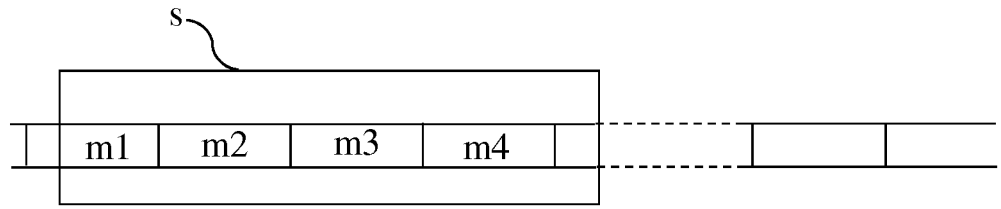
FIGS. 2a and 2b respectively represent the principle of segmentation of the code words, the refining and re-centering of the linear forms.

If the answer is yes, a segment s comprising 2N' pieces of data received is obtained. The segment s is represented in FIG. 2a. It comprises a certain number of received words and thus constitutes the pseudo-word on which the processing is based. It must be noted that it can happen that the start of the segment s does not coincide with the start of a code word.

At the following step E404, the variable Nbseg is incremented by one unit.

The following step introduces the dual pivot algorithm for the first time. At this level, it consists in building candidate linear forms. At the step E405, the method activates the dual pivot algorithm according to an embodiment of the invention and transfers to it the reduction matrix M of the candidate linear forms and the segment s, and in response obtains a new reduction matrix M. To understand the process followed in greater detail, the dual pivot algorithm pivot is described in FIG. 5. This description is taken up again at the end of the description of the method.

At the following step E406, a check is made to see if the segment s can be reduced to a set of zero values. If the segment s can be reduced to a set of zero values, the method returns to the step E402. If not, it passes to the step E407.

The step E407 validates the candidate linear forms. Through the filter, the candidate form is applied to a set of code pseudo-words of the segment s. The proportion of 0 obtained makes it possible, by means of a threshold, to validate or not validate the candidate form. Various strategies can be envisaged to obtain this test function, and their relevance depends on the conditions of use and the expectations of the user (risk-taking versus computation time and means).

According to a first strategy, an acceptation threshold $S_a$ and a number K of pseudo-words are preliminarily fixed. The number n of times where 0 is obtained by application of the candidate form on one of the K pseudo-words is computed. If $$\frac{n}{K} > S_a$$

then the form is accepted, if not it is rejected. According to a second strategy, an acceptation threshold $S_a$, a rejection threshold $S_r$, a number k of consecutive pseudo-words and a maximum number $K_{max}$ of pseudo-words are preliminarily fixed. The test proceeds by iteration of k pseudo-words without exceeding a total number $K_{max}$. At the $i^{th}$ iteration, the number n of 0 obtained by application of the candidate form with i×k first pseudo-words is updated. If $$\frac{n}{i \times k} > S_a$$

then the form is accepted, if $$\frac{n}{i \times k} < S_r$$

then the form is rejected. Else, the process starts again with a new iteration. If the number $K_{max}$ of pseudo-words is exceeded, then the form is also rejected.

At the following step E408, the method checks to see whether a linear form of the dual code has been found. If the answer is yes, the method passes to the step E409. If not, it returns to the step E402.

At the step E409, a re-centering and a refining is carried out on the linear forms. This step is aimed at reducing the number of useful bits for the computations. The method determines a number ϵ of consecutive bits which may be withdrawn at the end of a segment s while at the same time making sure that there remains a complete code pseudo-word sized N' in the residual segment s'. The non-interleaving of the known dual linear forms leads to a suspicion of N' multiple distinct from N. If this suspicion is founded, each linear form must be capable of being translated by a length N" which is a divisor of N' closer to N. It is then enough to carry out a test, by self-correlation as described at the step E407, to determine the credibility of the value N". In the event of a positive response, N' takes the value of N", and the parameters of the encoding method of the binary frame of data as well as the matrix of linear forms chosen are updated.

Figure 2B:
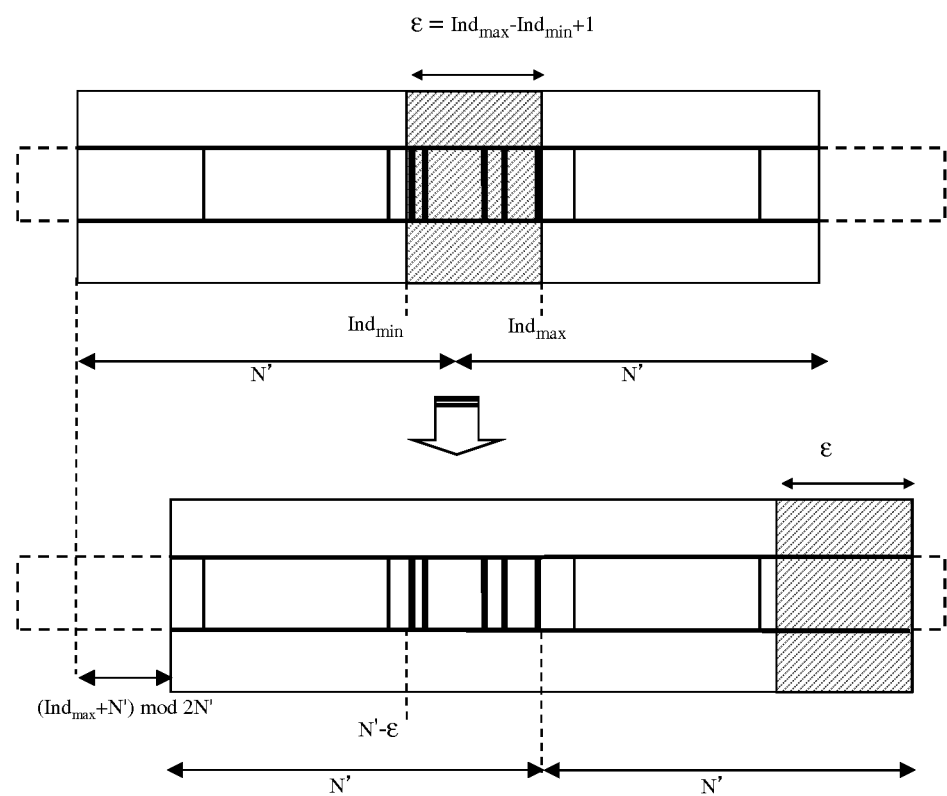

An example of the determining of the number c of consecutive bits that may be withdrawn at the end of a segment s is described through FIGS. 2a and 2b. This description brings out a pseudo-word with a length s containing code words of a length N (m1, etc) in FIG. 2a. The bold vertical lines of FIG. 2b represent the non-zero bits of the linear forms found. $Ind_{min}$ represents the position of the first non-zero bit. $Ind_{max}$ represents the position of the last non-zero bit resulting from the application of the linear form found on the pseudo-code word.

The number c is equal to the difference between $Ind_{max}$ and $Ind_{min}$ plus one. A shift of ($Ind_{max}$ plus N') modulo 2N' is applied to the linear forms and to the segments to come of data sized 2N'. Since the ϵ last bits of each segment are unnecessary for the processing, they can advantageously be eliminated during the computations. The step ends with the coarse synchronization.

At the following step E410, the filter is initialized in giving it the first coarse segmentation compatible with the encoder in the broad sense (length N' and coarse synchronization $t_0$), as well as the first forms of the dual code. Thus, the first phase comes to an end.

The second phase of the method which starts by the step E411 should conclude with the recognition of the error-correcting code. It will consist in refining the segmentation and synchronization parameters that take part in its reconstruction. This phase introduces the function of the self-adaptive filter, the importance of which is vital, as described here below, in the choice of pseudo-words to be filtered.

Figure 4B:
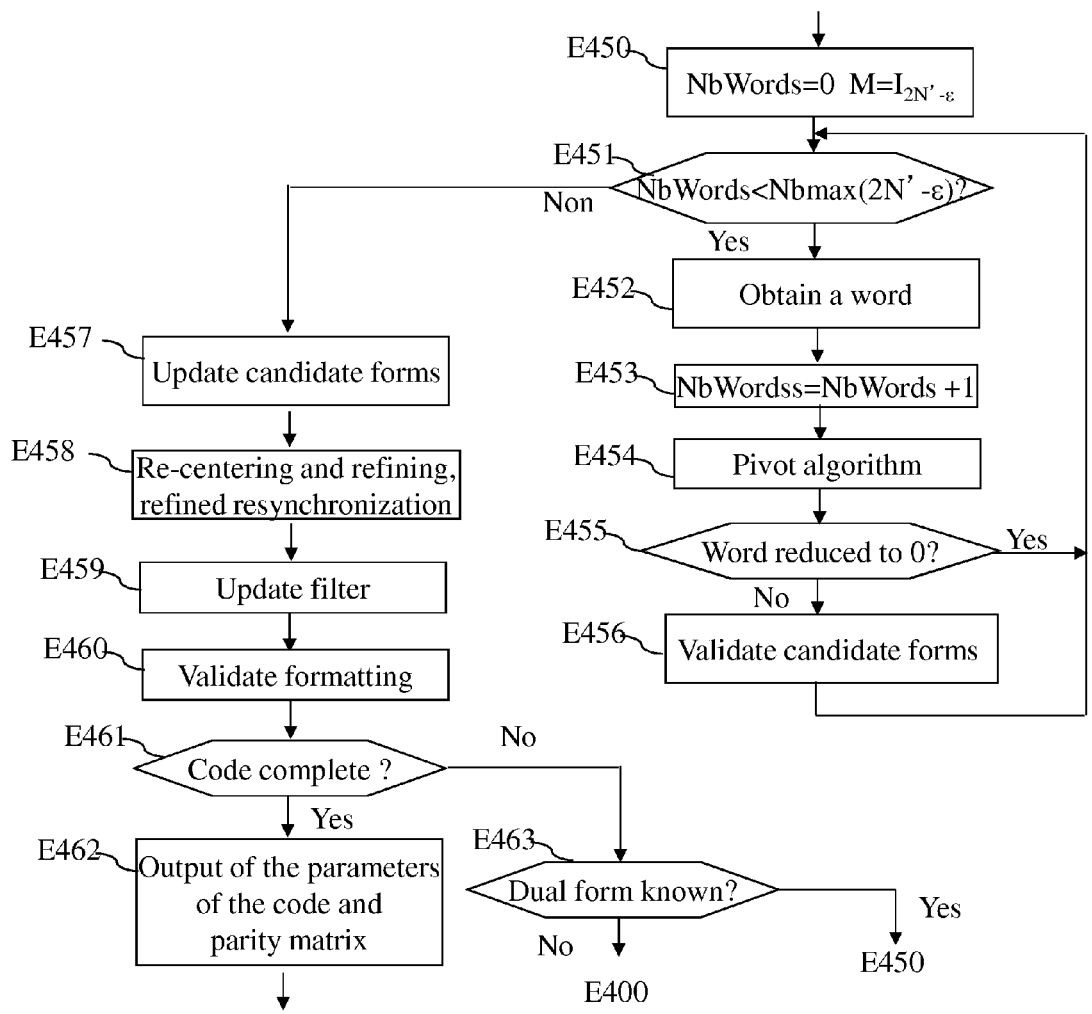

FIG. 4b describes the process followed. It starts with a call to the filter which takes charge of providing pseudo code words with a length 2N' of bits amputated by their last E bits. The filter is a self-adaptive device which eliminates or does not eliminate the data recognized as containing errors, in meeting two goals. The first goal is quantitative. It consists in imperatively meeting the requests of the algorithm in giving it a sufficient number of received pseudo code words. The second goal is qualitative. It consists in managing the quality of the pseudo code words transmitted by authorizing the pseudo-words received with recognized noises to ensure the necessary flowrate for the algorithm and to play on these recognized noises to confirm or invalidate the partial description of the dual code obtained during previous iterations of the algorithm according to an embodiment of the present invention. In order to meet the request for pseudo-words, the filter chooses a set of linear forms among those considered to belong to the dual code to make a screen of the received pseudo-words received that contain too many errors. It rejects any pseudo code words on which this set is not identically zero. The rediscovery by the algorithm according to an embodiment of the present invention of a form that is known but preliminarily excluded by the filter from the set enabling the screen reinforces the credibility of this linear form.

The second phase starts with the step E450 which places the variable NbWords at the zero value and places the matrix M at a value equal to the identity matrix $I_{2N'-\epsilon}$ sized $2N'-\epsilon$. NbWords is the number of pseudo-words received, already exploited for the rebuilding of dual linear forms.

At the following step E451, the method checks to see if the variable NbWords is smaller than a predetermined value $Nbmax(2N'-\epsilon)$. If the variable NbWords is smaller than a predetermined value $Nbmax(2N'-\epsilon)$, the method passes to the step E452. If not, it passes to the step E457.

At the step E452, a pseudo code word comprising 2N' received pieces of data is obtained.

At the following step E453, the variable NbWords is incremented by one unit.

At the following step E454, the method initially activates the dual pivot algorithm according to an embodiment of the invention, transfers to it the reduction matrix M and in response obtains a new reduction matrix M. This step is similar to the step E405 of the phase 1.

At the following step E455, a check is made to see if the received pseudo-code word can be reduced to a set of zero values. If the pseudo code word can be reduced to a set of zero values, the operation returns to the step 451. If not, it passes to the step E456.

At the step E456, the operation validates the candidate linear forms as described here above at the step E407 of FIG. 4a. Once this step is completed, the operation returns to the step E451.

The step E457 consists in updating the candidate linear forms. The method uses the classic Gauss pivot algorithm to reduce each linear form by all the other linear forms to obtain more elementary forms, for example by eliminating linear combinations of several disjoint dual linear forms.

At the step E458, the block refines the synchronization and cyclically offsets the linear forms accordingly. The fine synchronization is done similarly to that described in the step E409 of FIG. 4a. The pieces of information available make it possible to increase the value of c and thus reduce the size of the pieces of data examined. The finer the synchronization, the greater is the value of c and the closer it is to N'. If $\epsilon > N'$, it is possible to determine whether a length N" of translation of the dual linear forms is credible. If this is not the case, there is a suspicion of an N' that is a strict divisor of N. It is then possible to double N'. The parameters of the encoding method used to generate the redundant data as well as the matrix of linear forms chosen are updated.

At the step E459, the filter is updated with the offset information sized N' to be done according to the fine synchronization and with the new linear forms of the dual code.

The following step E460 is a step for validating and formatting. At this step, certain dual linear forms can be eliminated, and the knowledge of the length N of the code words is refined.

At the following step E461, a check is made to see if the parameters of the code such as N, $t_0$, its type (the size of the interleaver of the code if need be, the puncturing pattern if any, etc) and the linear forms generating the dual code are completely identified. If the answer is yes, the method passes to the step E462. If not, it passes to the step E463.

At the step E462, the validation system delivers the parameters of the binary string (N' and $t_0$) and those of the code such as its type, the characteristics of the interleaver, the puncturing pattern if any and the linear forms generating the dual code then forming a parity matrix.

At the step E463, the system checks to see if the set constituted by the known dual linear forms is empty. If the answer is yes, the method returns to the step E400. If not, it returns to the step E450.

4. Description of the Dual Pivot Algorithm

Figure 5:
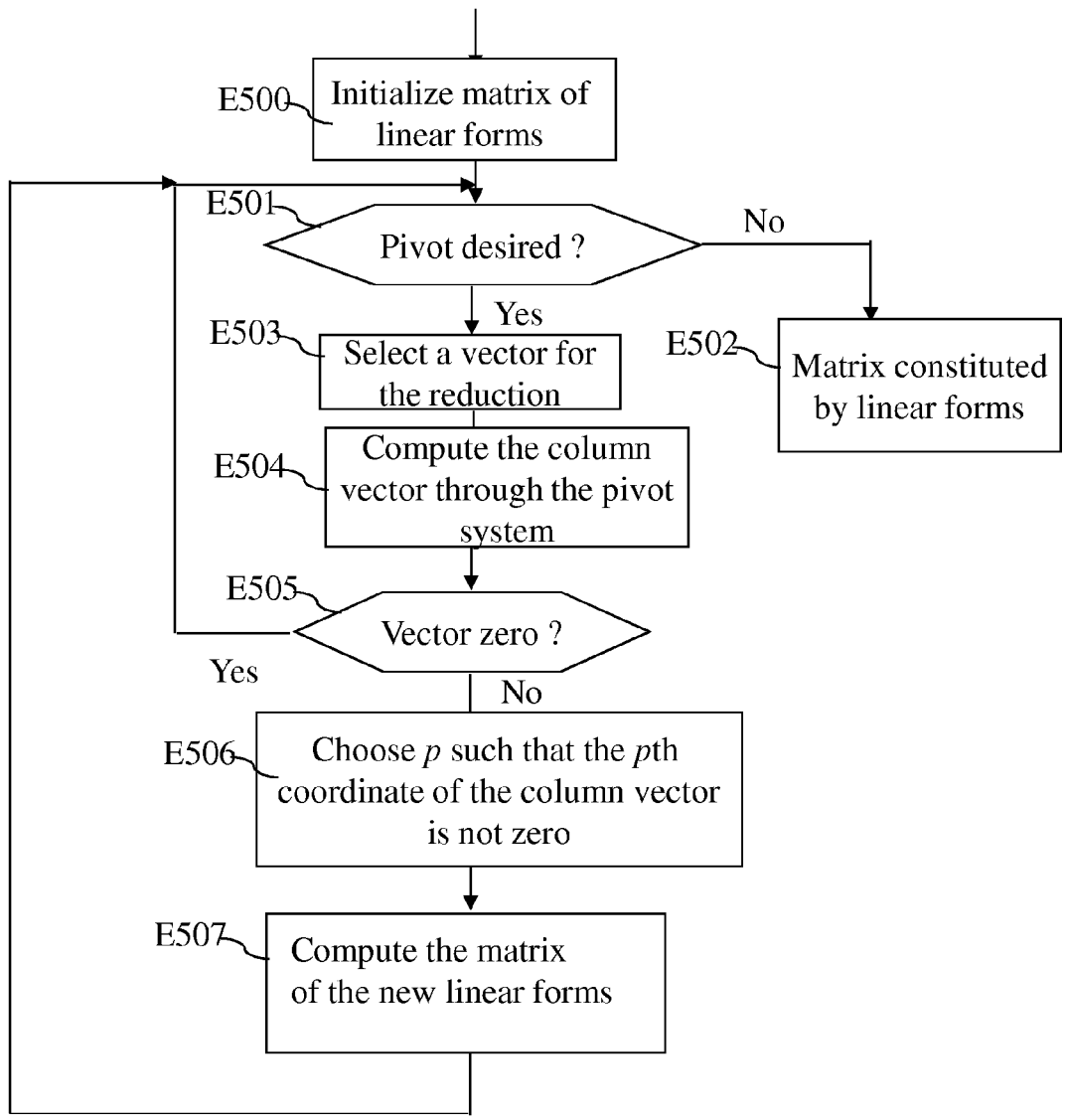
FIG. 5 describes the principle of operation of the dual pivot algorithm.

Referring to FIG. 5, we now describe the dual pivot algorithm according to an embodiment of the invention.

We present herein the principle of the dual pivot algorithm, which constitutes an original development of the classic Gauss pivot algorithm. It differs radically from it by the viewpoint adopted. The principle of the dual pivot algorithm relies on the computation of the linear forms directly in the dual space.

The dual pivot algorithm has the advantage of using only basic operations permitting elementary manipulations that can be transposed to the current electronic circuits. The implementation of this dual algorithm in flows makes it possible to obtain real-time access, which is a crucial imperative for its concrete generalization in devices exchanging digital data.

According to an embodiment of the invention, the linear forms generated are of lesser weight and comply with the structure before interleaving (linear codes or interleaved convolutive codes possibly punctured). The linear forms built by the dual pivot algorithm thus break the interleaver in delivering dual small words directly.

Furthermore, the dual pivot algorithm proves to be robust in the face of disturbance induced by transmission errors using classic architectures of error codes (for example linear codes or interlaced convolutive codes, possibly punctured). Indeed, the presence of errors in the transmitted words have no effect on the values taken by the linear forms, the weight of which is distributed outside the locations of the deteriorated bits. The lower the weight of a dual form, the less is it likely that its evaluation on the received words will be different from that taken on the transmitted words, those of the code. Thus, a form of the dual code has especially greater chances of cancelling out a set of received words as its significance is low. It is this type of form that is favored by the dual pivot algorithm.

The properties (i) and (ii) here below deliver a dual version of the Gauss pivot algorithm by means of a recurrence. The property (i) gives initial linear forms; the property (ii) expresses the consequences on the forms of a taking of a pivot. These two properties enable the iterative computation of the linear forms of reduction by the method or the device.

First of all, the following are the notations used to express the properties (i) and (ii).

Let K be a field and N a natural integer.

Let $(X_j)_{1 \leq j \leq N}$ be the dual base of the canonical base of $K^N$

Let i be a natural integer smaller than or equal to N. Let $P=\{p_1, \ldots, p_i\}$ be a part of $\{1, \ldots, N\}$ with i elements. The set P will serve to designate the numbers corresponding to the pivots, $p_k$ designating the number of the $k^{th}$ pivot.

Let $(v_k)_{1 \leq k \leq i}$ be a free family of $K^N$ such that, for any integer k between 1 and i, the vector $\bar{v}_k^{(v_l,p_l)1 \leq l \leq k-1}$ obtained by reduction of the vector $v_k$ by the pivot system $(v_l,p_l)_{1 \leq l \leq k-1}$ has a $p_k^{th}$ non-zero coordinate.

For any natural integer k smaller than i and any integer j between 1 and N, let $F_{k,j}$ be the linear form which has an associated generic vector v $F_{k,j}(v)=X_j(\bar{v}^{(v_l,p_l)1 \leq l \leq k})$, i.e. the $j^{th}$ coordinate of the vector $\bar{v}^{(v_l,p_l)1 \leq l \leq k-1}$ obtained by the reduction of the vector v by the pivot system $(v_l, p_l)_{1 \leq l \leq k}$. Let $\mathcal{F}_k$ be the matrix of $M_N(K)$, for which, for any value j ranging from 1 to N, the $j^{th}$ row is formed by the row vector $\mathcal{F}_{k,j}$ of the coordinates of the $j_{th}$ linear form $F_{k,j}$ in the canonical base of the dual of $K^N$.

The dual pivot algorithm has the task of updating this matrix of linear reduction forms each time that a pivot is taken.

The iterative computation of the linear forms by the dual pivot algorithm is done according to the following two properties:

(i) For any integer j ranging from 1 to N: $F_{0,j} = X_j$.

(ii) If i is non-zero then for any integer j ranging from 1 to N:

$$F_{i,j} = F_{i-1,j} - \frac{F_{i-1,j}(v_i)}{F_{i-1,p_i}(v_i)} F_{i-1,p_i}$$

i.e. in matrix terms $\mathcal{F}_0$ is the identity matrix sized N×N, and $$\mathcal{F}_i = \mathcal{F}_{i-1} - \frac{1}{F_{i-1,p_i}(v_i)} W_i \mathcal{F}_{i-1, p_i}$$

where $W_i$ designates the column vector formed by the coordinates of the vector $\overline{v}_i^{(v_l,p_l)1 \leq l \leq i-1}$ obtained by reduction of the vector $v_i$ by the pivot system $(v_l, p_l)_{1 \leq l \leq i-1}$.

Referring now to FIG. 5, a description is provided of the working of the algorithm in terms of processes.

In E500, the matrix of linear forms is initialized at the identity matrix.

The step E501 controls the passage to a supplementary pivot. If desired, the operation passes to the step E503. If not, it returns to the step E502 with the result being the matrix of linear forms.

At the step E503, a vector $v_i$ is selected which it will be sought to reduce.

At the step E504, the column vector $W_i$ obtained by reduction of the vector $v_i$ is computed.

At the step E505, a check is made to see if the column vector $W_i$ is a null vector. If the answer is yes, the operation returns to the step E501. If not, it passes to the step E506.

At the step E506, a pivot number p is chosen such that the $p^{th}$ coordinate of the column vector is not zero.

At the following step E507, the matrix of the linear forms is updated by a new computation of $\mathcal{F}_i$, see here above (ii).

CONCLUSION

Error-correcting codes currently are unavoidable for coping with the deterioration that any transmission is likely to create in digital data. A highly varied range of error-correcting codes is in use. It continues to foster mathematical and technological developments. This diversity of the codes implemented is unavoidable. Indeed, it meets protection requirements and a variety of open-ended technical constraints.

The error-correcting codes used in the correction of errors in digital transmission systems are characterized by parameters directly related to the nature of the transmission. An exemplary embodiment of the present disclosure implements means at the reception system that make it possible to identify these parameters as well as enable them to be recorded. This exemplary goal has the effect of providing flexibility in the management of the networks and of making it possible to develop self-configuring transmission systems for any type of error-correcting encoding used for the transmission of information.

An embodiment of the invention improves the blind recognition of error-correcting codes, especially by transposing it to the detection of a greater variety of codes. Its originality comes from its capacity to carry out a flow processing in order to achieve especially a real-time reconfiguration so as to be capable of meeting the constraints of maintenance in operational conditions despite the constant increase in transmission bit rates. This technical possibility finds full meaning especially in fields of application such as cognitive radio or reconfigurable networks.

An embodiment of the invention thus processes error-correcting codes in the broad sense, i.e. codes capable of being constituted by several additional codes or blocks enabling improvement in the performance of correcting codes, such as block codes, convolutive codes, series or parallel concatenated codes, turbo-codes, LDPC codes, with interleaver or puncturing. This list is not exhaustive. Embodiments of the invention can work with other types of codes.

An embodiment of the invention highlights a method that inputs a binary stream to be analyzed that is encoded and contains errors in order to reconstitute the encoder. The method then carries out iterative processing operations enabling blind identification of the parameters of the encoder really used by means of an innovative and fast algorithm according to the technique that can be divided into two phases which shall be described in detail here below in this document.

In particular, a device of an embodiment of the invention relies on an algorithm known as the dual pivot algorithm which takes inspiration from the classic Gauss pivot algorithm which has been entirely reworked from a dual viewpoint. The transposition of the processing to the dual world proposes several advantages. Indeed, this technical choice makes it possible first of all to greatly reduce the weight of the computations for searching for the parameters of the codes. The algorithm also enables the generation, even in noisy conditions, of the less significant words of the dual code. An embodiment of the invention thus permits the use of small-sized resources in terms of time and memory space as well as complexity of the electronic circuits during a hardware implementation.

Although the present disclosure has been described with reference to one or more examples, workers skilled in the art will recognize that changes may be made in form and detail without departing from the scope of the disclosure and/or the appended claims.

The invention claimed is:

1. A method for determining an error-correcting code implemented at sending, comprising:
   receiving a binary string by a receiver device, the binary string comprising at least one code word of size N provided by said error correcting code implemented at sending;
   a first step of coarsely determining, by the receiver device, said error correcting code implementing the following sub-steps:
      selection of an integer value of a candidate size N' of a code word to define a segmentation parameter, equal to 2N', said value N' being selected so as to be greater than the length N of code words to be blindly determined;
      segmentation of said binary string by using said segmentation parameter, delivering segments of 2N' consecutive bits;
      for at least one of said segments, determination, for a set of consecutive bits of said segment, of at least one first candidate linear form of a dual code of said error correcting code, and validation of said at least one first candidate linear form;

if at least one first candidate linear form is validated, determination of the number $\epsilon$ of consecutive bits located at the end of said segment, which are useless to determine said at least one first validated candidate linear form;

updating said segmentation parameter of said binary string taking into account said number $\epsilon$;

and a second step of refining, by the receiver device, the determining of said correcting code implementing at least one iteration of the following sub-steps:

filtering said binary string, taking account of said at least one first validated linear form and of said segmentation parameter, delivering at least one new segment of consecutive bits of size equal to 2N'-$\epsilon$;

determination, for a set of consecutive bits of said new segment, of at least one second candidate linear form of a dual code of said correcting code, and validation of said at least one second candidate linear form;

if at least one second candidate linear form is validated, increasing of said number $\epsilon$ of consecutive bits located at the end of said segment, which are useless to determine said at least one second validated candidate linear form;

updating said segmentation parameter of said binary string taking into account said number $\epsilon$, wherein a last iteration of said substeps of said second step is performed when said correcting code is identified using said updated segmentation parameter and said second validated candidate linear form, said updated segmentation parameter being representative of said size N of codeword delivered by said correcting code.

2. The method for determining according to claim 1, wherein said step of selection takes account of at least one element belonging to the group consisting of:
the divisors of said value N';
a predetermined list of compatible integers.

3. The method for determining according to claim 1, wherein said substep of determination, for a set of consecutive bits of said segment, of at least one first candidate linear form of a dual code of said error correcting code is implemented for at least two segments of said binary string, and so long as the number of segments processed is below a predetermined threshold.

4. The method for determining according to claim 1, wherein said substep of determination, for a set of consecutive bits of said segment, of at least one first candidate linear form of a dual code of said error correcting code and said substep of determination, for a set of consecutive bits of said new segment, of at least one second candidate linear form of a dual code of said error correcting code implement a dual version of a Gauss pivot type of algorithm.

5. The method for determining according to claim 4, wherein said dual version of the Gauss pivot type algorithm determines at least one candidate linear form in the following form:

if i is zero:

$$F_{0,j} = X_j;$$

if i is not zero:

$$F_{i,j} = F_{i-1,j} - \frac{F_{i-1,j}(v_i)}{F_{i-1,p_i}(v_i)} F_{i-1,p_i}$$

with:
N as a natural integer;
i a natural integer smaller than or equal to N;
k a natural integer smaller than i;
j an integer ranging from 1 to N,
$(X_j)_{1 \leq j \leq N}$ the base that is the dual of the canonical base of $K^N$, where K is a field;

$P = \{p_1, \ldots, p_i\}$ a part of $\{1, \ldots, N\}$ with i elements;
$(v_k)_{1 \leq k \leq i}$ a free family of $K^N$ such that for any integer k between 1 and i, the vector $\underline{v}_k(v_1, p_1) 1 \leq k \leq i$ obtained by reduction of the vector $v_k$ by the system $(v_l, p_l)_{1 \leq l \leq k-1}$ has a non-zero $p_k$ th coordinate;
$F_{k,j}$ is the linear form which associates $F_{k,j}(v) = X_j(\underline{v}^{(v_l, p_l) 1 \leq l \leq k}$ with a generic vector v.

6. The method for determining according to claim 1, wherein said steps of validation of said at least one first and second candidate linear form test respectively said at least one first and second candidate linear form on at least one following segment in said binary string and compare a number of obtained zero values with a predetermined threshold.

7. The method for determining according to claim 1, wherein said step of filtering detects the segments of said binary string that do not verify at least one parity relationship defined by said at least one validated first linear form and eliminates a segment detected as a function of the size of said received binary string.

8. The method for determining according to claim 1, wherein the method comprises a step for updating the set of candidate linear forms used to determine the second candidate linear form, implementing a Gauss pivot type algorithm, making it possible to reduce each candidate linear form of said set by all the other linear forms.

9. The method for determining according to claim 1, wherein said error-correcting code associated is identified by reading in a correspondence table.

10. A device for determining an error-correcting code implemented at sending, by processing a binary string received, wherein the device comprises the following modules implemented by at least one of hardware of an electronic circuit or a computer configured by a computer program comprising instructions stored in a non-transitory memory:

a first module configured to coarsely determine said error correcting code comprising:
a module for selecting an integer value of a candidate size N' of code word to define a segmentation parameter, equal to 2N', said value N' being selected so as to be greater than the length N of codewords to be blindly determined;
a module for segmenting said binary string by using said segmentation parameter, delivering segments of 2N' consecutive bits;
for at least one of said segments, a module for determining, for a set of consecutive bits of said segment, of at least one first candidate linear form of a dual code of said error-correcting code, and validation of said at least one first candidate linear form;
if at least one first candidate linear form is validated, a module for determining of the number $\epsilon$ of consecutive bits located at the end of said segment, which are useless to determine said at least one first validated candidate linear form;
a module for updating said segmentation parameter of said binary string taking into account said number $\epsilon$;

and a second module configured to refine the determining of said error-correcting code, comprising the following modules activated for at least one iteration:
a module for filtering said binary string, taking account of said at least one first validated linear form and of said segmentation parameter, delivering at least one new segment of consecutive bits of size equal to 2N'-$\epsilon$;
a module for determining, for a set of consecutive bits of said new segment, of at least one second candidate linear form of a dual code of said error-correcting code, and validation of said at least one second candidate linear form;

if at least one second candidate linear form is validated, a module for increasing of said number $\epsilon$ of consecutive bits located at the end of said segment, which are useless to determine said at least one second validated candidate linear form;

a module for updating said segmentation parameter of said binary string taking into account said number $\epsilon$, wherein a last iteration of said substeps of said second step is performed when said error-correcting code is identified using said updated segmentation parameter and said second validated candidate linear form, said updated segmentation parameter being representative of said size N of codeword delivered by said error-correcting code; and wherein the device is reconfigured to process the binary string according to the error correction code identified by the second module.

11. A non-transitory computer-readable medium comprising a computer program stored thereon, the program comprising instructions for execution of a method for determining at least one parameter of an error-correcting code implemented at sending, by processing of a received binary string comprising at least one code word of size N provided by said error correcting code implemented at sending, when the program is executed by a computer, the method comprising:

a first step of coarsely determining said error correcting code implementing the following sub-steps:

selection of an integer value of a candidate size N' of code word to define a segmentation parameter, equal to 2N', said value N' being selected so as to be greater than the length N of codewords to be blindly determined;

segmentation of said binary string by using said segmentation parameter, delivering segments of 2N' consecutive bits;

for at least one of said segments, determination, for a set of consecutive bits of said segment, of at least one first candidate linear form of a dual code of said error correcting code, and validation of said at least one first candidate linear form;

if at least one first candidate linear form is validated, determination of the number e of consecutive bits located at the end of said segment, which are useless to determine said at least one first validated candidate linear form;

updating said segmentation parameter of said binary string taking into account said number $\epsilon$;

and a second step of refining the determining of said error correcting code implementing at least one iteration of the following sub-steps:

filtering said binary string, taking account of said at least one first validated linear form and of said segmentation parameter, delivering at least one new segment of consecutive bits of size equal to 2N' $\epsilon$;

determination, for a set of consecutive bits of said new segment, of at least one second candidate linear form of a dual code of said error correcting code, and validation of said at least one second candidate linear form;

if at least one second candidate linear form is validated, increasing of said number e of consecutive bits located at the end of said segment, which are useless to determine said at least one second validated candidate linear form;

updating said segmentation parameter of said binary string taking into account said number $\epsilon$, wherein a last iteration of said substeps of said second step is performed when said error correcting code is identified using said updated segmentation parameter and said second validated candidate linear form, said updated segmentation parameter being representative of said size N of codeword delivered by said error correcting code.

* * * * *